US008795487B2

(12) United States Patent
Ritchie et al.

(10) Patent No.: US 8,795,487 B2
(45) Date of Patent: Aug. 5, 2014

(54) PHYSICAL VAPOR DEPOSITION CHAMBER WITH ROTATING MAGNET ASSEMBLY AND CENTRALLY FED RF POWER

(75) Inventors: Alan Ritchie, Menlo Park, CA (US); Keith Miller, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 513 days.

(21) Appl. No.: 13/075,841

(22) Filed: Mar. 30, 2011

(65) Prior Publication Data

US 2011/0240466 A1   Oct. 6, 2011

Related U.S. Application Data

(63) Continuation-in-part of application No. 13/048,440, filed on Mar. 15, 2011.

(60) Provisional application No. 61/319,377, filed on Mar. 31, 2010, provisional application No. 61/328,725, filed on Apr. 28, 2010, provisional application No. 61/371,774, filed on Aug. 9, 2010, provisional application No. 61/393,309, filed on Oct. 14, 2010.

(51) Int. Cl.
*C23C 14/35* (2006.01)

(52) U.S. Cl.
USPC ............... 204/298.08; 204/298.2; 204/298.11

(58) Field of Classification Search
USPC .............................. 204/298.2, 298.11, 298.08
See application file for complete search history.

(56) References Cited

U.S. PATENT DOCUMENTS

| | | | | |
|---|---|---|---|---|
| 4,714,536 A | * | 12/1987 | Freeman et al. | 204/298.2 |
| 5,382,344 A | * | 1/1995 | Hosokawa et al. | 204/298.2 |
| 6,149,784 A | * | 11/2000 | Su et al. | 204/298.11 |
| 6,287,437 B1 | * | 9/2001 | Pandhumsoporn et al. | 204/298.13 |
| 6,395,156 B1 | * | 5/2002 | Hsueh et al. | 204/298.04 |
| 7,179,351 B1 | | 2/2007 | Juliano et al. | |
| 7,244,344 B2 | | 7/2007 | Brown et al. | |
| 2002/0185370 A1 | | 12/2002 | Gopalraja et al. | |

(Continued)

FOREIGN PATENT DOCUMENTS

JP      01-309965 A      12/1989

OTHER PUBLICATIONS

International Search Report and Written Opinion mailed Dec. 7, 2011 for PCT Application No. PCT/US2011/030718.
U.S. Appl. No. 13/148,440, filed Mar. 15, 2011, Rasheed et al.

(Continued)

*Primary Examiner* — Keith Hendricks
*Assistant Examiner* — Jason M Berman
(74) *Attorney, Agent, or Firm* — Moser Taboada; Alan Taboada

(57) ABSTRACT

Embodiments of the present invention provide improved methods and apparatus for physical vapor deposition (PVD) processing of substrates. In some embodiments, an apparatus for physical vapor deposition (PVD) may include a target assembly having a target comprising a source material to be deposited on a substrate, an opposing source distribution plate disposed opposite a backside of the target and electrically coupled to the target along a peripheral edge of the target, and a cavity disposed between the backside of the target and the source distribution plate; an electrode coupled to the source distribution plate at a point coincident with a central axis of the target; and a magnetron assembly comprising a rotatable magnet disposed within the cavity and having an axis of rotation that is aligned with a central axis of the target assembly, wherein the magnetron assembly is not driven through the electrode.

19 Claims, 3 Drawing Sheets

(56) References Cited

U.S. PATENT DOCUMENTS

| | | |
|---|---|---|
| 2008/0083610 A1 | 4/2008 | Tang et al. |
| 2008/0142359 A1 | 6/2008 | Gopalraja et al. |
| 2010/0096261 A1 | 4/2010 | Hoffman et al. |
| 2010/0264017 A1 | 10/2010 | Nam et al. |

OTHER PUBLICATIONS

Search Report from The State Intellectual Property Office of The People's Republic of China received Feb. 21, 2014 for Chinese Patent Application No. 201180020863X.

* cited by examiner

US 8,795,487 B2

PHYSICAL VAPOR DEPOSITION CHAMBER WITH ROTATING MAGNET ASSEMBLY AND CENTRALLY FED RF POWER

CROSS-REFERENCE TO RELATED APPLICATIONS

This application is a continuation-in-part of co-pending U.S. patent application Ser. No. 13/048,440, filed Mar. 15, 2011, which claims benefit of U.S. provisional patent application Ser. No. 61/319,377, filed Mar. 31, 2010, U.S. provisional patent application Ser. No. 61/328,725, filed Apr. 28, 2010, U.S. provisional patent application Ser. No. 61/371,774, filed Aug. 9, 2010, and U.S. provisional patent application Ser. No. 61/393,309, filed Oct. 14, 2010, each of which are herein incorporated by reference.

FIELD

Embodiments of the present invention generally relate to physical vapor deposition processing equipment.

BACKGROUND

In semiconductor processing, physical vapor deposition (PVD) is a conventionally used process for deposition of materials atop a substrate. A conventional PVD process includes bombarding a target comprising a source material with ions from a plasma, causing the source material to be sputtered from the target. The ejected source material may be accelerated towards the substrate via a negative voltage or bias formed on the substrate, resulting in a deposition of the source material atop the substrate. In some processes, following the deposition of the source material, the deposited material may be resputtered by bombarding the substrate with ions from the plasma, thereby facilitating a redistribution of the material about the substrate. During the PVD process a magnetron may be rotated near a backside of the target to promote uniformity of the plasma.

Some conventional radio frequency (RF) PVD process chambers provide RF energy to a target via electrical feeds coupled to the target. The inventors have discovered that deposition processes in conventional PVD chambers having RF energy coupled to the target often yield non-uniform deposition profiles on substrates being processed.

Accordingly, the inventors have provided improved methods and apparatus for PVD processes that may provide more uniform deposition profiles on substrates being processed in a PVD process chamber.

SUMMARY

Embodiments of the present invention provide improved methods and apparatus for physical vapor deposition (PVD) processing of substrates. In some embodiments, an apparatus for physical vapor deposition (PVD) may include a target assembly having a target comprising a source material to be deposited on a substrate, an opposing source distribution plate disposed opposite a backside of the target and electrically coupled to the target along a peripheral edge of the target, and a cavity disposed between the backside of the target and the source distribution plate; an electrode coupled to the source distribution plate at a point coincident with a central axis of the target; and a magnetron assembly comprising a rotatable magnet disposed within the cavity and having an axis of rotation that is aligned with a central axis of the target assembly, wherein the magnetron assembly is not driven through the electrode.

In some embodiments, an apparatus for physical vapor deposition (PVD) may include a process chamber having a substrate support disposed in an interior of the process chamber; a target assembly having a target comprising a source material to be deposited on a substrate and disposed in the interior of the process chamber facing a support surface of the substrate support, an opposing source distribution plate disposed opposite a backside of the target and electrically coupled to the target along a peripheral edge of the target, and a cavity disposed between the backside of the target and the source distribution plate; an electrode coupled to the source distribution plate at a point coincident with a central axis of the target; an RF power source coupled to the electrode to provide RF energy to the target; and a magnetron assembly comprising a rotatable magnet disposed within the cavity and having an axis of rotation that is aligned with a central axis of the target assembly, wherein the magnetron assembly is not driven through the electrode.

In some embodiments, an apparatus for physical vapor deposition (PVD) may include a process chamber having a substrate support disposed in an interior of the process chamber; a target assembly having a target comprising a source material to be deposited on a substrate and disposed in the interior of the process chamber facing a support surface of the substrate support, an opposing source distribution plate disposed opposite a backside of the target and electrically coupled to the target along a peripheral edge of the target, and a cavity disposed between the backside of the target and the source distribution plate; a ground shield disposed about and spaced apart from the target assembly; a plurality of dielectric spacers coupled between the ground shield and the source distribution plate, the plurality of dielectric spacers disposed in an axisymmetric pattern with respect to the central axis of the target; an electrode passing through an opening in the ground shield and coupled to the source distribution plate at a point coincident with a central axis of the target; an RF power source coupled to the electrode to provide RF energy to the target; and a magnetron assembly comprising a rotatable magnet disposed within the cavity and having an axis of rotation that is aligned with a central axis of the target assembly, wherein the magnetron assembly is not driven through the electrode.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
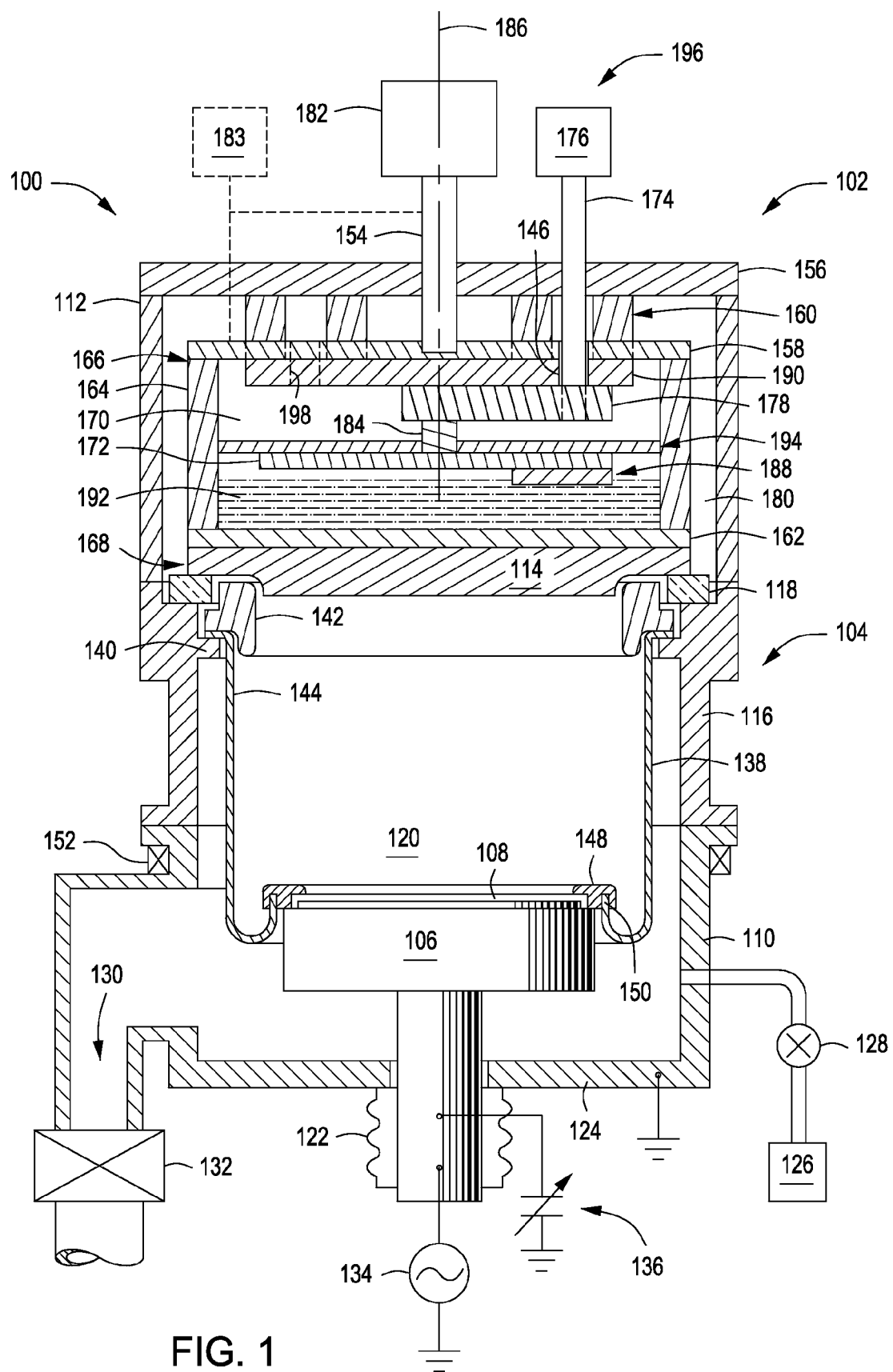
FIG. 1 depicts a simplified cross sectional view of a physical vapor deposition chamber in accordance with some embodiments of the present invention.
Figure 2:
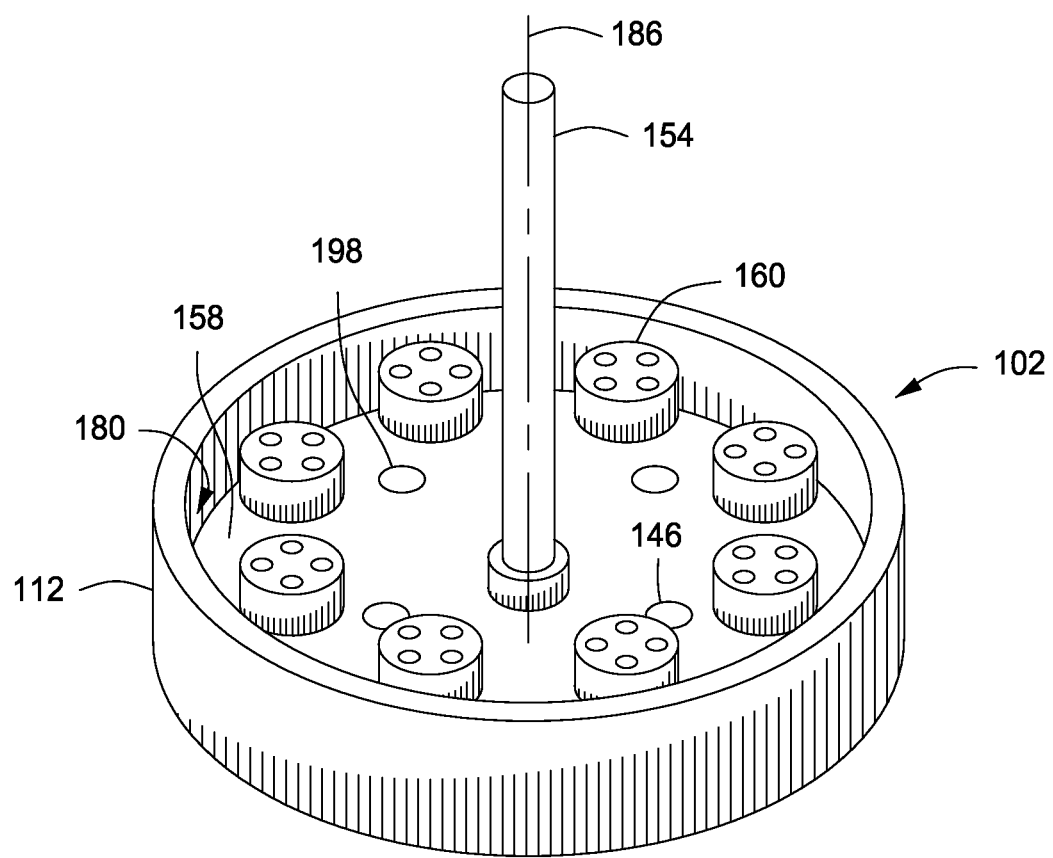
FIG. 2 depicts a partial isometric view of a target assembly in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for physical vapor deposition (PVD) processing of substrates are provided herein. In some embodiments, the improved methods and apparatus may yield more uniform deposition profiles on substrates being processed in accordance with the inventive methods and apparatus described herein. Embodiments of the inventive apparatus may advantageously allow for the coupling of RF power to a target in a PVD process chamber such that electromagnetic fields proximate the target and within the chamber are more uniform, thereby facilitating more uniform distribution of the target material on a substrate being processed.

FIG. 1 depicts a simplified, cross-sectional view of a PVD chamber 100 in accordance with some embodiments of the present invention. Examples of suitable PVD chambers include the ALPS® Plus and SIP ENCORE® PVD processing chambers, both commercially available from Applied Materials, Inc., of Santa Clara, Calif. Other processing chambers from Applied Materials, Inc. or other manufactures may also benefit from modifications in accordance with the inventive apparatus disclosed herein.

In some embodiments of the present invention, the PVD chamber 100 includes a target assembly 102 disposed atop a process chamber 104. The process chamber 104 contains a substrate support 106 for receiving a substrate 108 thereon. The substrate support 106 may be located within a grounded enclosure wall 110, which may be a chamber wall (as shown) or a grounded shield, such as the ground shield 112, covering at least some portions of the target assembly 102 above the target 114. In some embodiments (not shown), the ground shield 112 could be extended below the target 114 to enclose the substrate support 106 as well.

The substrate support 106 has a material-receiving surface facing the principal surface of the target 114 and supports the substrate 108 to be sputter coated in planar position opposite to the principal surface of the target 114. The substrate support 106 may support the substrate 108 in a central region 120 of the process chamber 104. The central region 120 is defined as the region above the substrate support 106 during processing (for example, between the target 114 and the substrate support 106 when in a processing position).

In some embodiments, the substrate support 106 may be vertically movable through a bellows 122 connected to a bottom chamber wall 124 to allow the substrate 108 to be transferred onto the substrate support 106 through a load lock valve (not shown) in the lower portion of the process chamber 104 and thereafter raised to a deposition, or processing position. One or more processing gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

In some embodiments, the process chamber 104 may further include a grounded bottom shield 138 connected to a ledge 140 of the grounded conductive aluminum adapter 116. A dark space shield 142 may be supported on the grounded bottom shield 138 and may be fastened to the grounded bottom shield 138 by screws or other suitable manner. The metallic threaded connection between the grounded bottom shield 138 and the dark space shield 142 allows the two shields 138, 142 to be grounded to the grounded conductive aluminum adapter 116. The grounded conductive aluminum adapter 116 in turn is sealed and grounded to the aluminum chamber sidewall 110. Both shields 138, 142 are typically formed from hard, non-magnetic stainless steel.

The bottom shield 138 extends downwardly and may include a generally tubular portion 144 having a generally constant diameter. The bottom shield 138 extends along the walls of the grounded conductive aluminum adapter 116 and the chamber wall 110 downwardly to below a top surface of the substrate support 106 and returns upwardly until reaching a top surface of the substrate support 106 (e.g., forming a u-shaped portion at the bottom). A cover ring 148 rests on the top of the upwardly extending inner portion 150 of the bottom shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to shield the periphery of the substrate 108 from deposition.

In some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the grounded conductive aluminum adapter 116. The magnet 152 may be an electromagnet and may be coupled to a power source (not shown) for controlling the magnitude of the magnetic field generated by the electromagnet.

The target assembly 102 has an RF power source 182 connected to an electrode 154. The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used. The inventors have discovered that although some improvement in processing uniformity may be obtained by coupling RF energy to a tubular collar surrounding a centrally disposed magnetron shaft (for example, as described in United States Patent Application Publication 2010/0096261, published Apr. 22, 2010 and entitled, "Physical Vapor Deposition Reactor with Circularly Symmetric RF Feed and DC Feed to the Sputter Target," as well as U.S. patent application Ser. No. 13/048, 440, Filed Mar. 15, 2011, and entitled, "Apparatus for Physical Vapor Deposition Having Centrally Fed RF Energy," each of which are assigned to the assignee of the present invention), the process uniformity unexpectedly deteriorates when coupling RF energy having higher frequencies. Specifically, as the frequency of the RF energy applied increases, the processing uniformity deteriorates. The inventors have discovered that by coupling the RF energy to the target assembly using a smaller diameter electrode disposed axially in line with the central axis of the target, enhanced process uniformity may be obtained even if the magnetron drive mechanism is moved to a non-axisymmetric location with respect to the target assembly.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments. the electrode may have a length of between about 0.5 to about 12 inches. The electrode 154 may be fabricated from any suitable conductive material, such as aluminum, copper, silver, or the like.

The electrode 154 may pass through a circular ground plate 156 and is coupled to a source distribution plate 158. The ground plate 156 may comprise any suitable conductive material, such as aluminum, copper, or the like. A plurality of insulators 160 couple the source distribution plate 158 to the ground plate 156. The insulators 160 provide stability and rigidity of the assembly without electrically coupling the source distribution plate 158 to the ground plate 156. The open spaces between the insulators 160 allow for RF wave propagation along the surface of the source distribution plate 158. In some embodiments, the insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158.

The target 114 may be unitary or fabricated from several components and may further be coupled to a backing plate 162. The backing plate 162 (or the target 114 directly) is coupled to the source distribution plate 158 via a conductive member 164 to receive RF energy proximate the peripheral edge of the target 114. The RF energy may be provided in a more symmetric and uniform manner as compared to conventional PVD chambers due, at least in part, to the central position of the electrode 154

The target 114 may be supported on a grounded conductive aluminum adapter 116 through a dielectric isolator 118. The target 114 comprises a material to be deposited on the substrate (not shown) during sputtering, such as a metal or metal oxide. In some embodiments, the backing plate 162 may be coupled to the source distribution plate-facing surface of the target 114. The backing plate 162 may comprise a conductive material, such as copper-zinc, copper-chrome, or the same material as the target, such that RF power can be coupled to the target 114 via the backing plate 162. Alternatively, the backing plate 162 may be non-conductive and may include conductive elements (not shown) such as electrical feedthroughs or the like for coupling the source distribution plate-facing surface of the target 114 to the second end 168 of the conductive member 164. The backing plate 162 may be included, for example, to improve structural stability of the target 114. The target 114 partially forms the ceiling of the process chamber 104.

The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162. An insulative gap 180 is provided between the ground plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the ground plate 156 and the source distribution plate 158 depends on the dielectric material between the ground plate 156 and the source distribution plate 158. Where the dielectric material is predominantly air, the distance between the ground plate 156 and the source distribution plate 158 should be between 5 mm and 40 mm.

A cavity 170 is at least partially defined by the inner surface of the conductive member 164, a target facing surface of the source distribution plate 158, and a source distribution plate facing surface of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the ground plate 156. The end of the motor shaft 174 protruding from the ground plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 158 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 188 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Figure 3:
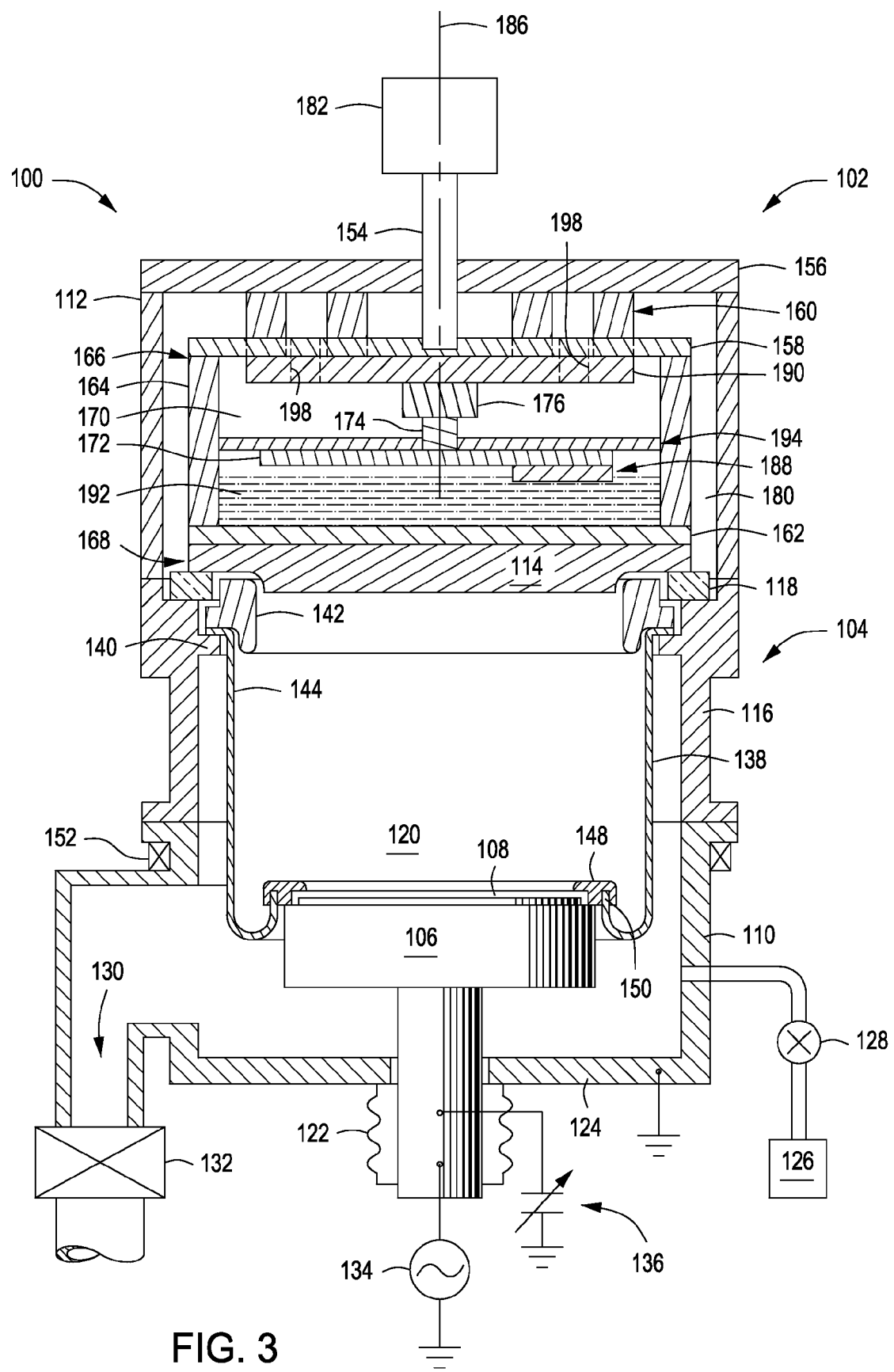
FIG. 3 depicts a simplified cross-sectional view of a physical vapor deposition chamber in accordance with some embodiments of the present invention.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, as depicted in FIG. 3, the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

Thus, methods and apparatus for PVD processing has been provided. In some embodiments, the inventive methods and apparatus provide centrally fed RF energy to a target of the process chamber which may advantageously provide more uniform deposition profiles on substrates being processed in a PVD process chamber as compared to conventional PVD processing apparatus.

While the foregoing is directed to embodiments of the present invention, other and further embodiments of the invention may be devised without departing from the basic scope thereof.

The invention claimed is:

1. An apparatus for physical vapor deposition (PVD), comprising:
    a target assembly having a target comprising a source material to be deposited on a substrate, an opposing source distribution plate disposed opposite a backside of the target and electrically coupled to the target along a peripheral edge of the target, and a cavity disposed between the backside of the target and the source distribution plate;
    an electrode coupled to the source distribution plate at a point coincident with an intersection of the source distribution plate and a central axis of the target; and
    a magnetron assembly comprising a rotatable magnet disposed within the cavity and having an axis of rotation that is aligned with a central axis of the target assembly, wherein the magnetron assembly is not driven through the electrode.

2. The apparatus of claim 1, further comprising:
    a radio frequency (RF) power source coupled to the electrode to provide RF energy to the target.

3. The apparatus of claim 1, wherein the target assembly further comprises:
    a ground plate covering the source distribution plate; and
    a plurality of insulators coupling the ground plate to the source distribution plate.

4. The apparatus of claim 3, wherein the plurality of insulators are symmetrically arranged.

5. The apparatus of claim 3, wherein the target assembly further comprises:
    a dielectric material disposed between the ground plate and the source distribution plate.

6. The apparatus of claim 5, wherein the dielectric material comprises predominantly air.

7. The apparatus of claim 6, wherein a distance between the ground plate and the source distribution plate is about 5 mm to about 40 mm.

8. The apparatus of claim 1, wherein the target assembly further comprises:
    a conductive member disposed between the backside of the target and the source distribution plate to at least partially form sidewalls of the cavity and to propagate RF energy from the source distribution plate to the peripheral edge of the target.

9. The apparatus of claim 8, wherein the conductive member further comprises:
    a cylindrical member having a first end coupled to a target-facing surface of the source distribution plate proximate a peripheral edge of the source distribution plate and a second end coupled to a source distribution plate-facing surface of the target proximate the peripheral edge of the target.

10. The apparatus of claim 1, wherein the target further comprises:
a backing plate to support the source material.

11. The apparatus of claim 1, wherein the magnetron assembly further comprises:
a shaft disposed through a first opening in the source distribution plate in a position that is not aligned with the central axis of the target and rotationally coupled to the rotatable magnet; and
a motor disposed outside the cavity and coupled to the shaft to rotate the rotatable magnet.

12. The apparatus of claim 11, further comprising:
one or more second openings disposed through the source distribution plate and arranged, in combination with the first opening, in a symmetrical pattern with respect to the central axis.

13. The apparatus of claim 11, further comprising:
a gear box disposed within the cavity and coupled between the shaft and the rotatable magnet to transfer torque from the shaft to the rotatable magnet.

14. The apparatus of claim 1, further comprising a coolant disposed within the cavity.

15. The apparatus of claim 1, wherein the magnetron assembly further comprises:
a motor disposed within the cavity and coupled to the rotatable magnet assembly.

16. An apparatus for physical vapor deposition (PVD), comprising:
a process chamber having a substrate support disposed in an interior of the process chamber;
a target assembly having a target comprising a source material to be deposited on a substrate and disposed in the interior of the process chamber facing a support surface of the substrate support, an opposing source distribution plate disposed opposite a backside of the target and electrically coupled to the target along a peripheral edge of the target, and a cavity disposed between the backside of the target and the source distribution plate;
an electrode coupled to the source distribution plate at a point coincident with an intersection of the source distribution plate and a central axis of the target;
an RF power source coupled to the electrode to provide RF energy to the target; and
a magnetron assembly comprising a rotatable magnet disposed within the cavity and having an axis of rotation that is aligned with a central axis of the target assembly, wherein the magnetron assembly is not driven through the electrode.

17. The apparatus of claim 16, wherein the magnetron assembly further comprises:
a shaft disposed through a first opening in the source distribution plate in a position that is not aligned with the central axis of the target, the shaft rotationally coupled to the rotatable magnet; and
a motor disposed outside the cavity and coupled to the shaft to rotate the rotatable magnet.

18. The apparatus of claim 16, wherein the magnetron assembly further comprises:
a motor disposed within the cavity and coupled to the rotatable magnet assembly.

19. An apparatus for physical vapor deposition (PVD), comprising:
a process chamber having a substrate support disposed in an interior of the process chamber;
a target assembly having a target comprising a source material to be deposited on a substrate and disposed in the interior of the process chamber facing a support surface of the substrate support, an opposing source distribution plate disposed opposite a backside of the target and electrically coupled to the target along a peripheral edge of the target, and a cavity disposed between the backside of the target and the source distribution plate;
a ground shield disposed about and spaced apart from the target assembly;
a plurality of dielectric spacers coupled between the ground shield and the source distribution plate, the plurality of dielectric spacers disposed in an axisymmetric pattern with respect to the central axis of the target;
an electrode passing through an opening in the ground shield and coupled to the source distribution plate at a point coincident with an intersection of the source distribution plate and a central axis of the target;
an RF power source coupled to the electrode to provide RF energy to the target; and
a magnetron assembly comprising a rotatable magnet disposed within the cavity and having an axis of rotation that is aligned with a central axis of the target assembly, wherein the magnetron assembly is not driven through the electrode.

* * * * *